(12) United States Patent
Chen (10) Patent No.: US 11,521,973 B2
(45) Date of Patent: Dec. 6, 2022

(54) 3D ARCHITECTURE OF TERNARY CONTENT-ADDRESSABLE MEMORY METHOD FOR THE SAME

(71) Applicant: MACRONIX INTERNATIONAL CO., LTD., Hsinchu (TW)

(72) Inventor: Liang-Yu Chen, Tainan (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 378 days.

(21) Appl. No.: 16/936,544

(22) Filed: Jul. 23, 2020

(65) Prior Publication Data

US 2022/0028858 A1 Jan. 27, 2022

(51) Int. Cl.
*G11C 15/04* (2006.01)
*H01L 27/10* (2006.01)
*H01L 27/105* (2006.01)
*H01L 27/02* (2006.01)

(52) U.S. Cl.
CPC .......... *H01L 27/1052* (2013.01); *G11C 15/04* (2013.01); *H01L 27/0207* (2013.01)

(58) Field of Classification Search
CPC .. G11C 15/04; H01L 27/1052; H01L 27/0207

USPC ....................................................... 257/401
See application file for complete search history.

(56) References Cited

U.S. PATENT DOCUMENTS 10,734,063 B2 * 8/2020 Nii ...................... G11C 11/4087

* cited by examiner

*Primary Examiner* — Monica D Harrison
(74) *Attorney, Agent, or Firm* — McClure, Qualey & Rodack, LLP (57) ABSTRACT

Disclosed is a 3D architecture of ternary content-addressable memory (TCAM), comprising a first transistor layer, a second transistor layer, a third transistor layer and a fourth transistor layer. The first transistor layer and the second transistor layer are disposed on a first plane. The third transistor layer and the fourth transistor layer are respectively stacked on the first transistor layer and the second transistor layer in a second direction perpendicular to the first plane. Two of the first transistor layer, the second transistor layer, the third transistor layer and the fourth transistor layer are a first transistor and a second transistor of a first memory cell of the TCAM. The other two of the first transistor layer, the second transistor layer, the third transistor layer and the fourth transistor layer are a first transistor and a second transistor of a second memory cell of the TCAM.

16 Claims, 9 Drawing Sheets

3D ARCHITECTURE OF TERNARY CONTENT-ADDRESSABLE MEMORY METHOD FOR THE SAME

BACKGROUND OF THE INVENTION

Field of the Invention

The invention relates to a 3D architecture of ternary content-addressable memory.

Description of the Related Art

Ternary Content-Addressable Memory (TCAM) is a memory which can store three states (e.g., 0, 1 and a third state). TCAM may be applied to routers which do not need accurate matching and field of big data. With the development of data science, TCAM is widely applied. In view of the need of TCAM, the circuit layout of TCAM is a topic of industry research.

SUMMARY OF THE INVENTION

An aspect of the present invention discloses a 3D architecture of ternary content-addressable memory (TCAM), comprising a first transistor layer, a second transistor layer, a third transistor layer and a fourth transistor layer. The first transistor layer is disposed on a first plane, and extends in a first direction parallel to the first plane. The second transistor layer is disposed on the first plane, is parallel to the first transistor layer, and extends in the first direction. The third transistor layer is stacked on the first transistor layer in a second direction perpendicular to the first plane. The fourth transistor layer is stacked on the second transistor layer in the second direction. Two of the first transistor layer, the second transistor layer, the third transistor layer and the fourth transistor layer are a first transistor and a second transistor of a first memory cell of the TCAM. The other two of the first transistor layer, the second transistor layer, the third transistor layer and the fourth transistor layer are a first transistor and a second transistor of a second memory cell of the TCAM.

Another aspect of the present invention discloses a 3D architecture of ternary content-addressable memory (TCAM), comprising a first transistor channel layer, a second transistor channel layer, a third transistor channel layer and a fourth transistor channel layer. The first transistor channel layer is disposed on a first plane, and extends in a first direction parallel to the first plane. The second transistor channel layer is disposed on the first plane, is parallel to the first transistor channel layer, and extends in the first direction. The third transistor channel layer is stacked on the first transistor channel layer in a second direction perpendicular to the first plane. The fourth transistor channel layer is stacked on the channel second transistor layer in the second direction. The first transistor channel layer and the third transistor channel layer belong to a first transistor of a memory cell of the TCAM. The second transistor channel layer, and the fourth transistor channel layer belong to a second transistor of the memory cell of the TCAM.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
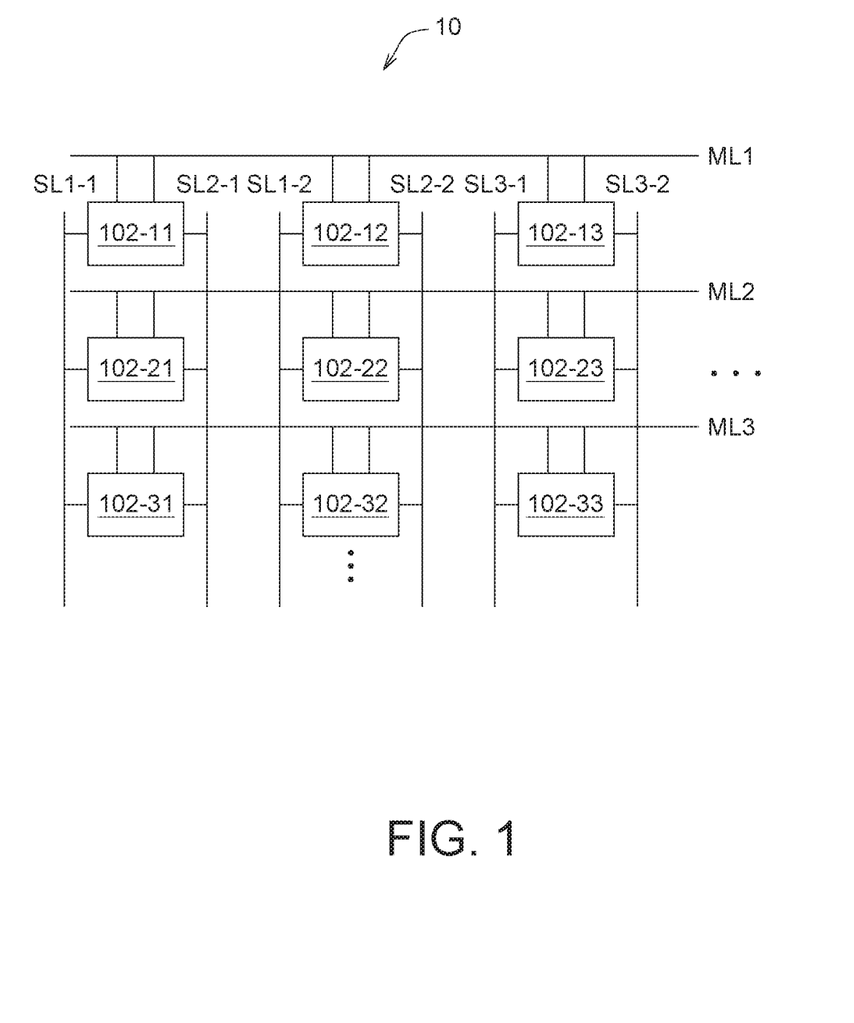
FIG. 1 shows a block diagram portion of Ternary Content-Addressable Memory (TCAM) according to an embodiment of the present invention.
Figure 2:
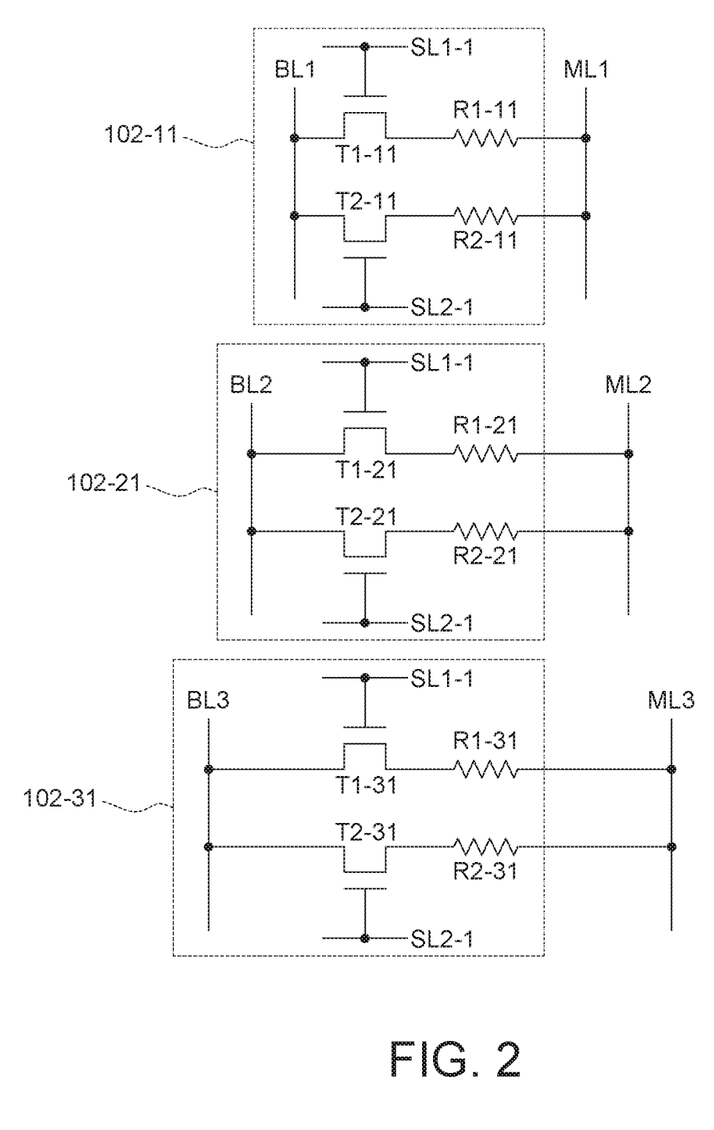
FIG. 2 shows a block diagram of three memory cells according to an embodiment of the present invention.

Referring to FIG. 1, FIG. 1 shows a block diagram portion of Ternary Content-Addressable Memory (TCAM) according to an embodiment of the present invention. The TCAM 10 may include a number of memory cell 102-11~102-33. FIG. 2 may be referred for the details of each of the memory cell can. FIG. 2 shows a block diagram of three of the memory cells 102-11, 102-21, 102-31 of the TCAM 10. Each of the memory cells includes a first transistor, a second transistor, a first memory element, a second memory element, a first search line, a second search line, a match line and a bit line. For the memory cell 102-11, the memory cell 102-11 includes a first transistor T1-11, a second transistor T2-11, a first memory element R1-11, a second memory element R2-11, a first search line SL-1, a second search line SL2-1, a match line ML1 and a bit line BL1. A first terminal of the first transistor T1-11 is coupled to the match line ML1 via the first memory element R1-11. A second terminal of the first transistor T1-11 is coupled to the bit line BL1. A control terminal of the first transistor T1-11 is coupled to the first search line SL1-1. A first terminal of the second transistor T2-11 is coupled to the match line ML1 via the second memory element R2-11. A second terminal of the second transistor T2-11 is coupled to the bit line BD. A control terminal of the second transistor T2-11 is coupled to the second search line SL2-1, wherein a signal on the second search line SL2-1 is an inverse of a signal on the first search line SL1-1, That is, when the signal on the first search line SL1-1 is 0, the signal on the second search line SL2-1 is 1; when the signal on the first search line SL1-1 is 1, the signal on the second search line SL2-1 is 0. The memory cells 102-21, 102-31 are similar to the memory cell 102-11, but noted that since the memory cells 102-11, 102-21, 102-31 belong to different rows, they do not share the same match line and the same bit line.

In this embodiment, the first transistors and the second transistors may be Metal-Oxide-Semiconductor Field-Effect Transistor (MOSFET), stacked-nanowire, stacked-nanosheet, stacked-fin FET, stacked-forksheet, stacked junctionless FET (JL-FET), stacked FeFET and so on. The first transistors and the second transistors may be N-type or P-type. The first memory elements and the second memory elements may be resistive random-access memory, for example, transition metal oxide (TMO) ReRAM, phase-change memory (PCRAM), conduction bridge RAM, spin-transfer torque (STT)-MRAM, spin-orbit torque (SOT)-MRAM, ferroelectric tunnel junction (FTJ), FeRAM and so on. That is, each of the first memory elements and the second memory elements may have a high resistance state (HRS) and a low resistance state (LRS). Each of the memory cells stores data by using the combination of the HRS and the LRS of the first memory elements and the second memory element.

Figure 3:
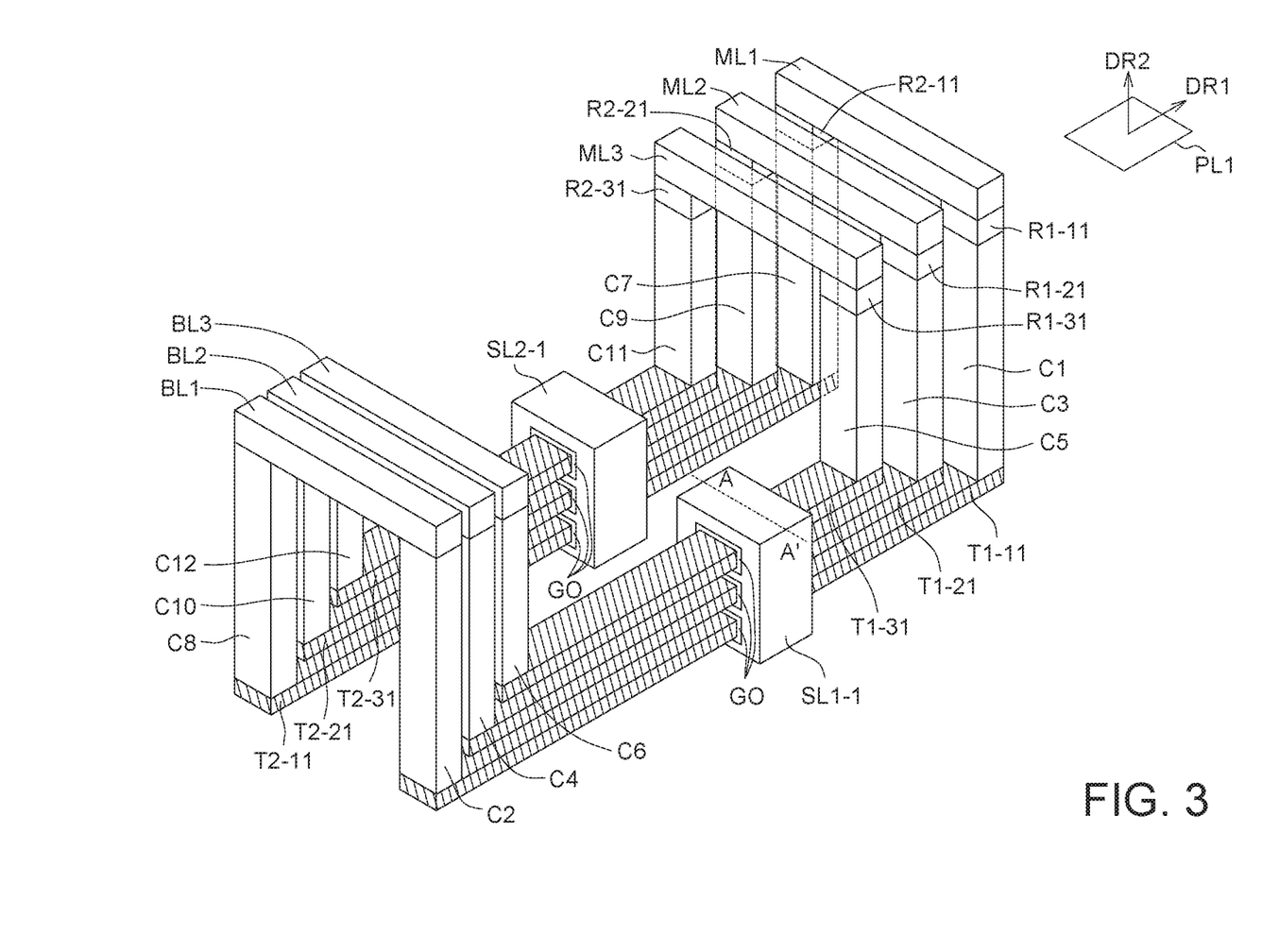
FIG. 3 shows a scheme diagram of portion of the TCAM architecture according to an embodiment of the present invention.

In prior art, TCAM is a 2D array for circuit layout. In order to further save layout area, the present invention provides a 3D architecture of TCAM. Referring to FIG. 3, FIG. 3 shows a scheme diagram of portion of TCAM architecture according to an embodiment of the present invention. FIG. 3 shows the circuit layout of the three memory cells in FIG. 2. The first transistor T1-11 and the second transistor T2-11 of the first memory cell 102-11 are disposed on a first plane PL1. In an embodiment, the first transistor T1-11 and the second transistor T2-11 of the first memory cell 102-11 extend in a first direction DR1 parallel to the first plane PL1, and are parallel to each other. The first transistor T1-21 and the second transistor T2-21 of the second memory cell 102-21 are respectively stacked on the first transistor T1-11 and the second transistor T2-11 of the first memory cell 102-11 in a second direction DR2 perpendicular to the first plane PL1. In an embodiment, the first transistor T1-21 and the second transistor T2-21 of the second memory cell 102-21 extend in the first direction DR1 parallel to the first plane PL1, and are parallel to each other. The first transistor T1-31 and the second transistor T2-31 of the third memory cell 102-31 are respectively stacked on the first transistor T1-21 and the second transistor T2-21 of the second memory cell 102-21 in the second direction DR2. In an embodiment, the first transistor T1-31 and the second transistor T2-31 of the third memory cell 102-31 extend in the first direction DR1, and are parallel to each other. The first transistor T1-11 of the first memory cell 102-11, the first transistor T1-21 of the second memory cell 102-21, the first transistor T1-31 of the third memory cell 102-31 penetrate through the first search line SL1-1. The first transistor T1-11 of the first memory cell 102-11, the first transistor T1-21 of the second memory cell 102-21, the first transistor T1-31 of the third memory cell 102-31 respectively connect with the first search line SL1-1 by a gate oxide GO. The second transistor T2-11 of the first memory cell 102-11, the second transistor T2-21 of the second memory cell 102-21, the second transistor T2-31 of the third memory cell 102-31 penetrate through the second search line SL2-1. the second transistor T2-11 of the first memory cell 102-11, the second transistor T2-21 of the the second memory cell 102-21, the second transistor T2-31 of the third memory cell 102-31 respectively connect with the second search line SL2-1 by a gate oxide GO. A first contact material C1 is disposed on the first terminal of the first transistor T1-11 of the first memory cell 102-11, extends in the second direction, and is connected to the first match line ML1 via the first memory element R1-11. A second contact material C2 is disposed on the second terminal of the first transistor T1-11 of the first memory cell 102-11, extends in the second direction, and is connected to the first bit line BL1. A third contact material C3 is disposed on the first terminal of the first transistor T1-21 of the second memory cell 102-21, extends in the second direction, and is connected to the second match line ML2 via the first memory element R1-21. A fourth contact material C4 is disposed on the second terminal of the first transistor T1-21 of the second memory cell 102-21, extends in the second direction, and is connected to the second bit line BL2. A fifth contact material C5 is disposed on the first terminal of the first transistor T1-31 of the third memory cell 102-31, extends in the second direction, and is connected to the third match line ML3 via the first memory element R1-31. A sixth contact material C6 is disposed on the second terminal of the first transistor T1-31 of the third memory cell 102-31, extends in the second direction, and is connected to the third bit line BL3. A seventh contact material C7 is disposed on the first terminal of the second transistor T2-11 of the first memory cell 102-11, extends in the second direction, and is connected to the first match line ML1 via the second memory element R2-11. An eighth contact material C8 is disposed on the second terminal of the second transistor T2-11 of the first memory cell 102-11, extends in the second direction, and is connected to the first bit line BL1. A ninth contact material C9 is disposed on the first terminal of the second transistor T2-21 of the second is memory cell 102-21, extends in the second direction, and is connected to the second match line ML2 via the second memory element R2-21. A tenth contact material C10 is disposed on the second terminal of the second transistor T2-21 of the second memory cell 102-21, extends in the second direction, and is connected to the second bit line BL2. A eleventh contact material C11 is disposed on the first terminal of the second transistor T2-31 of the third memory cell 102-31, extends in the second direction, and is connected to the third match line ML3 via the second memory element R2-31. A twelfth contact material C12 is disposed on the second terminal of the second transistor T2-31 of the third memory cell 102-31, extends in the second direction, and is connected to the third bit line BL3.

Figure 4A:
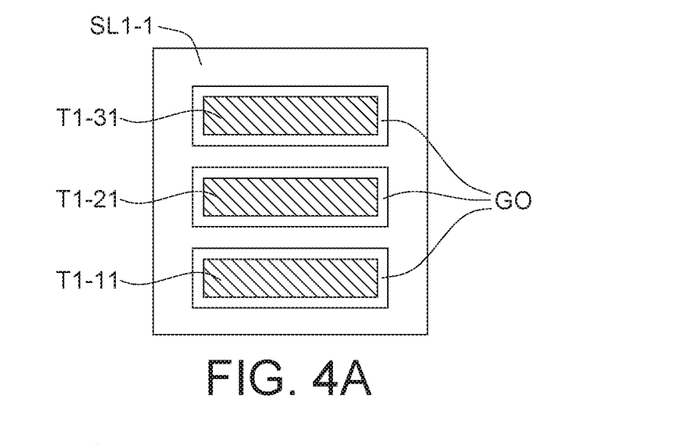
FIG. 4A shows a scheme diagram of the section at AA'.
Figure 4B:
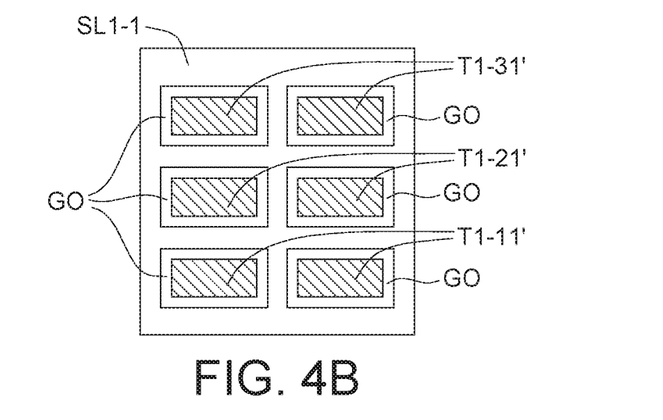
FIGS. 4B, 4C show scheme diagrams of the modification of the section at AA'.
Figure 4C:
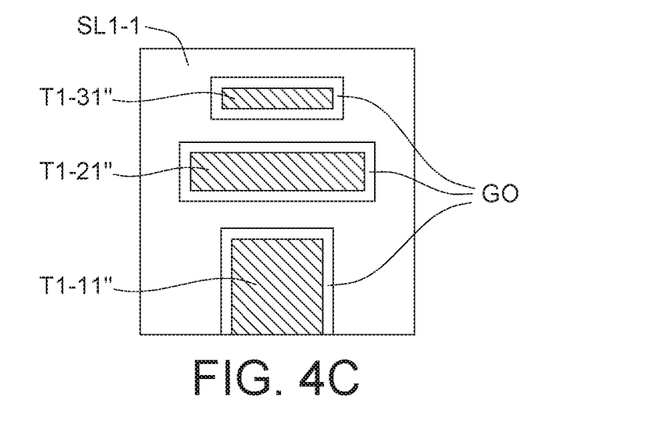

Referring to FIG. 4A, FIG. 4A shows a scheme diagram of the section at AA' in FIG. 3. In this embodiment, the number of channel of each of the first transistor for connecting to first search line is one, and the type is gate-all around (GAA). In another embodiment, the number of channel of each of the first transistor for connecting to the first search line may be two (or more than two), as shown in FIG. 4B. In yet another embodiment, the first transistors may be a combination of tri-gate FET and GAA FET, as shown in FIG. 4C. The second transistor may use the same analogy.

Noted that the above embodiment uses stacking three transistors for illustration, the present invention does not limited to. Any TCAM structure which stacks two or more transistors in 3D is included in the scope of the present invention.

Figure 5:
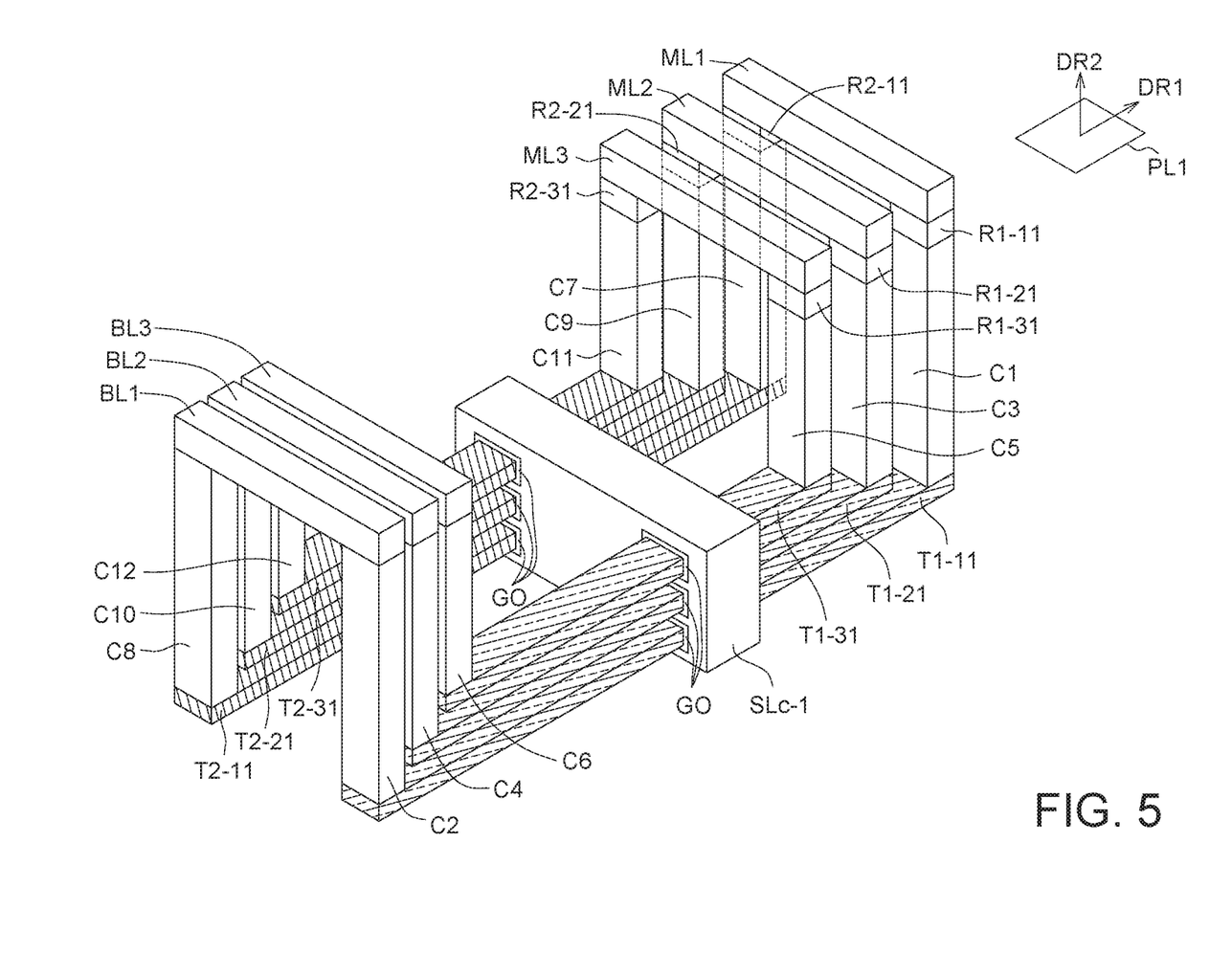
FIG. 5 shows a scheme diagram of portion of the TCAM architecture according to another embodiment of the present invention.

Referring to FIG. 5, FIG. 5 shows a scheme diagram of portion of TCAM architecture according to another embodiment of the present invention. this embodiment is similar to the embodiment of FIG. 3, the difference is that a doping type of the first transistors T1-11, T1-21, T1-31 is different from a doping type of the second transistors T2-11, T2-21, T2-31. For example, the first transistors T1-11, T1-21 T1-31 are N-type, and the second transistors T2-11, T2-21, T2-31 are P-type. Since the first transistors T1-11, T1-21, T1-31 and the second transistors T2-11, T2-21, T2-31 are transistors of different types, a search line can be shared. That is, the first search line SL1-1 and the second search line SL2-1 may be integrated into a common search line SLc-1, Comparing to the embodiment of FIG. 3, this embodiment may further save layout area.

Figure 6:
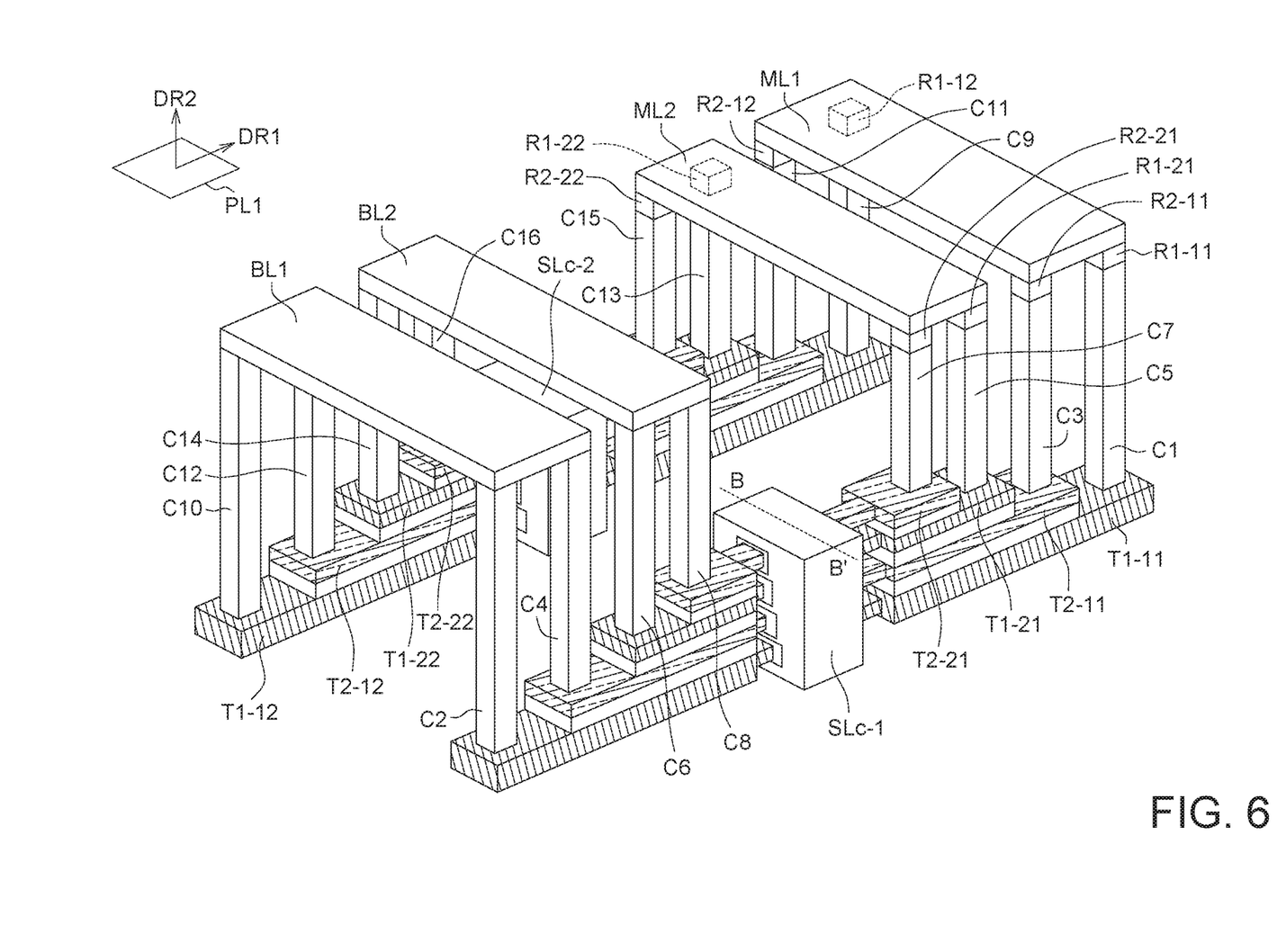
FIG. 6 shows a scheme diagram of portion of the TCAM architecture according to yet another embodiment of the present invention.

Referring to FIG. 6, FIG. 6 shows a scheme diagram of portion of TCAM architecture according to yet another embodiment of the present invention. The architecture shown in FIG. 6 includes the memory cells 102-11, 102-21, 102-12, 102-22 in FIG. 1. The detail of the memory cells may be referred to FIG. 2. In this embodiment, a doping type of the first transistors T1-11, T1-21, T1-12, T1-22 is different from a doping type of the second transistors T2-11, T2-21, T2-21, T2-22. For example, the first transistors T1-11, T1-21 T1-12, T1-22 are N-type, and the second transistors T2-11, T2-21, T2-12, T2-22 are P-type. Therefore, the first transistors T1-11, the second transistor T2-11 of the first memory cell 102-11 and the first transistor T1-21, the second transistor T2-21 of the second memory cell 102-21 may share a first common search line SLc-1, and the first transistor T1-12, the second transistor T2-12 of the third memory cell 102-12 and the first transistor T1-22, the second transistor T2-22 of the the fourth memory cell 102-22 may share a second common search line SLc-2.

The first transistor T1-11 of the first memory cell 102-11 and the first transistor T1-12 of the third memory cell 102-12 are disposed on a first plane PL1. In an embodiment, the first transistor T1-11 of the first memory cell 102-11 and the first transistor T1-12 of the third memory cell 102-12 extend in a first direction DR1 parallel to the first plane PL1, and are parallel to each other. The second transistor T2-11 of the first memory cell 102-11 and the second transistor T2-12 of the third memory cell 102-12 are respectively stacked on the first transistor T1-11 of the first memory cell 102-11 and the first transistor T1-12 of the third memory cell 102-12 in a second direction DR2 perpendicular to the first plane PL1, In an embodiment, the second transistor T2-11 of the first memory cell 102-11 and the second transistor T2-12 of the third memory cell 102-12 extend in the first direction DR1, and are parallel to each other. The first transistor T1-21 of the second memory cell 102-21 and the first transistor T1-22 of the fourth memory cell 102-22 are respectively stacked on the second transistor T2-11 of the first memory cell 102-11 and the second transistor T2-12 of the third memory cell 102-12 in the second direction DR2. In an embodiment, the first transistor T1-21 of the second memory cell 102-21 and the first transistor T1-22 of the fourth memory cell 102-22 extend in the first direction DR1, and are parallel to each other. The second transistor T2-21 of the second memory cell 102-21 and the second transistor T2-22 of the fourth memory cell 102-22 are respectively stacked on the first transistor T1-21 of the second memory cell 102-21 and the first transistor T1-22 of the fourth memory cell 102-22 in the second direction DR2. In an embodiment, the second transistor T2-21 of the second memory cell 102-21 and the second transistor T2-22 of the fourth memory cell 102-22 extend in the first direction DR1, and are parallel to each other.

The first transistor T1-11, the second transistor T2-11 of the first memory cell 102-11 and the first transistor T1-21, the second transistor T2-21 of the second memory cell 102-21 penetrate through the first common search line SLc-1. The first transistor T1-11, the second transistor T2-11 of the first memory cell 102-11 and the first transistor T1-21, the second transistor T2-21 of the second memory cell 102-21 are respectively connected with the first common search line SLc-1 by a gate oxide GO. The first transistor T1-12, the second transistor T2-12 of the third memory cell 102-12 and the first transistor T1-22, the second transistor T2-22 of the fourth memory cell 102-22 penetrate through the second common search line SLc-2. The first transistor T1-12, the second transistor T2-12 of the third memory cell 102-12 and the first transistor T1-22, the second transistor T2-22 of the fourth memory cell 102-22 are respectively connected with the second common search line SLc-2 by a gate oxide GO.

A first contact material C1 is disposed on a first terminal of the first transistor T1-11 of the first memory cell 102-11, extends in the second direction, and is connected to the first match line ML1 via the first memory element R1-11. A second contact material C2 is disposed on a second terminal of the first transistor T1-11 of the first memory cell 102-11, extends in the second direction, and is connected to the first bit line BL1. A third contact material C3 is disposed on a first terminal of the second transistor T2-11 of the first memory cell 102-11, extends in the second direction, and is connected to the first match line ML1 via the second memory element R2-11. A fourth contact material C4 is disposed on a second terminal of the second transistor T2-11 of the first memory cell 102-11, extends in the second direction, and is connected to the first bit line BL1, A fifth contact material C5 is disposed on a first terminal of the first transistor T1-21 of the second memory cell 102-21, extends in the second direction, and is connected to the second match line ML2 via the first memory element R1-21, A sixth contact material C6 is disposed on a second terminal of the first transistor T1-21 of the second memory cell 102-21, extends in the second direction, and is connected to the second bit line BL2. A seventh contact material C7 is disposed on a first terminal of the second transistor T2-21 of the second memory cell 102-21, extends in the second direction, and is connected to the second match line ML2 via the second memory element R2-21. An eighth contact material C8 is disposed on a second terminal of the second transistor T2-21 of the second memory cell 102-21, extends in the second direction, and is connected to the second bit line BL2. A ninth contact material C9 is disposed on a first terminal of the first transistor T1-12 of the third memory cell 102-12, extends in the second direction, and is connected to the first match line ML1 via the first memory element R1-12. A tenth contact material C10 is disposed on a second terminal of the first transistor T1-12 of the third memory cell 102-12, extends in the second direction, and is connected to the first bit line BL1. A eleventh contact material C10 is disposed on a first terminal of the second transistor T2-12 of the third memory cell 102-12, extends in the second direction, and is connected to the first match line ML1 via the second memory element R2-12. A twelfth contact material C12 is disposed on a second terminal of the second transistor T2-12 of the third memory cell 102-12, extends in the second direction, and is connected to the first bit line BL1. A thirteenth contact material C13 is disposed on a first terminal of the first transistor T1-22 of the fourth memory cell 102-22, extends in the second direction, and is connected to the second match line ML2 via the first memory element R1-22. A fourteenth contact material C14 is disposed on a second terminal of the first transistor T1-22 of the fourth memory cell 102-22, extends in the second direction, and is connected to the second bit line BL2. A fifteenth contact material C15 is disposed on a first terminal of the second transistor T2-22 of the fourth memory cell 102-22, extends in the second direction, and is connected to the second match line ML2 via the second memory element R2-22. A sixteenth contact material C16 is disposed on a second terminal of the second transistor T2-22 of the fourth memory cell 102-22, extends in the second direction, and is connected to the second bit line BL2.

In this embodiment, the first transistor and the second transistor of the same memory cell could be stacked in the same "stack". Furthermore, since the memory cells in the same column may share a common search line, they could be stacked in the same "stack".

Figure 7A:
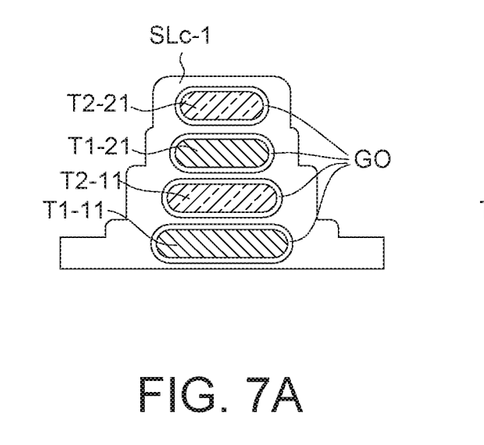
FIG. 7A shows a scheme diagram of the section at BB'.
Figure 7B:
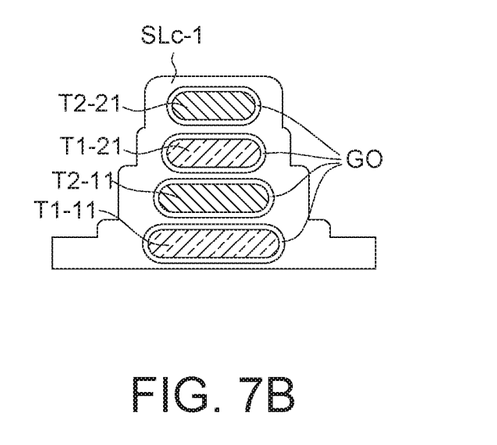
FIGS. 7B-7D show scheme diagrams of the modification of the section at BB'.
Figure 7C:
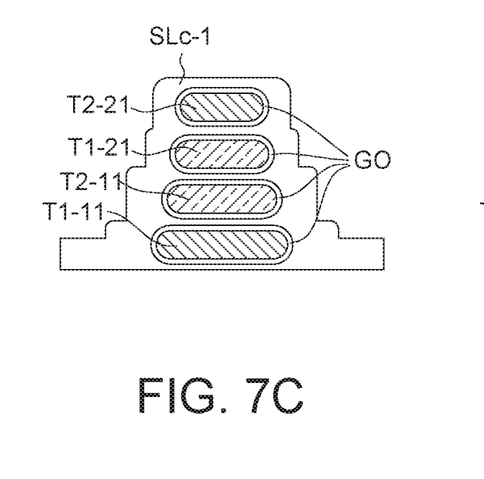
Figure 7D:
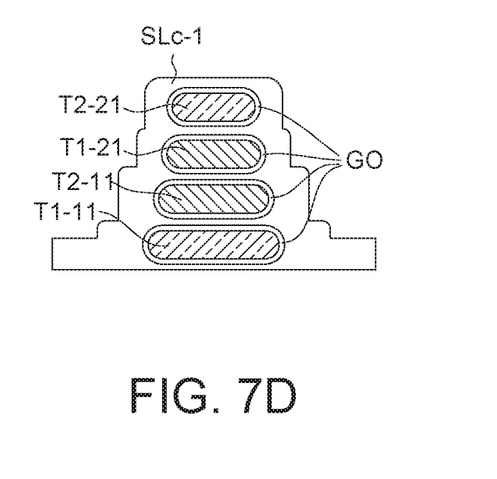

Referring to FIG. 7A, FIG. 7A shows a scheme diagram of the section at BB' in FIG. 6. The first transistor T1-11, the second transistor T2-11 of the first memory cell 102-11 and the first transistor T1-21, the second transistor T2-21 of the second memory cell 102-21 are stacked in order from bottom to top, and the doping types of the transistors are respectively N, P, N, P from bottom to top. In another embodiment, as shown in FIG. 7B, the doping types of the first transistor T1-11, the second transistor T2-11 of the first memory cell 102-11 and the first transistor T1-21, the second transistor T2-21 of the second memory cell 102-21 may respectively be P, N, P, N, or N, P, P, N, from bottom to top, as shown in FIG. 7C, or P, N, N, P as shown in FIG. 7D.

Figure 8A:
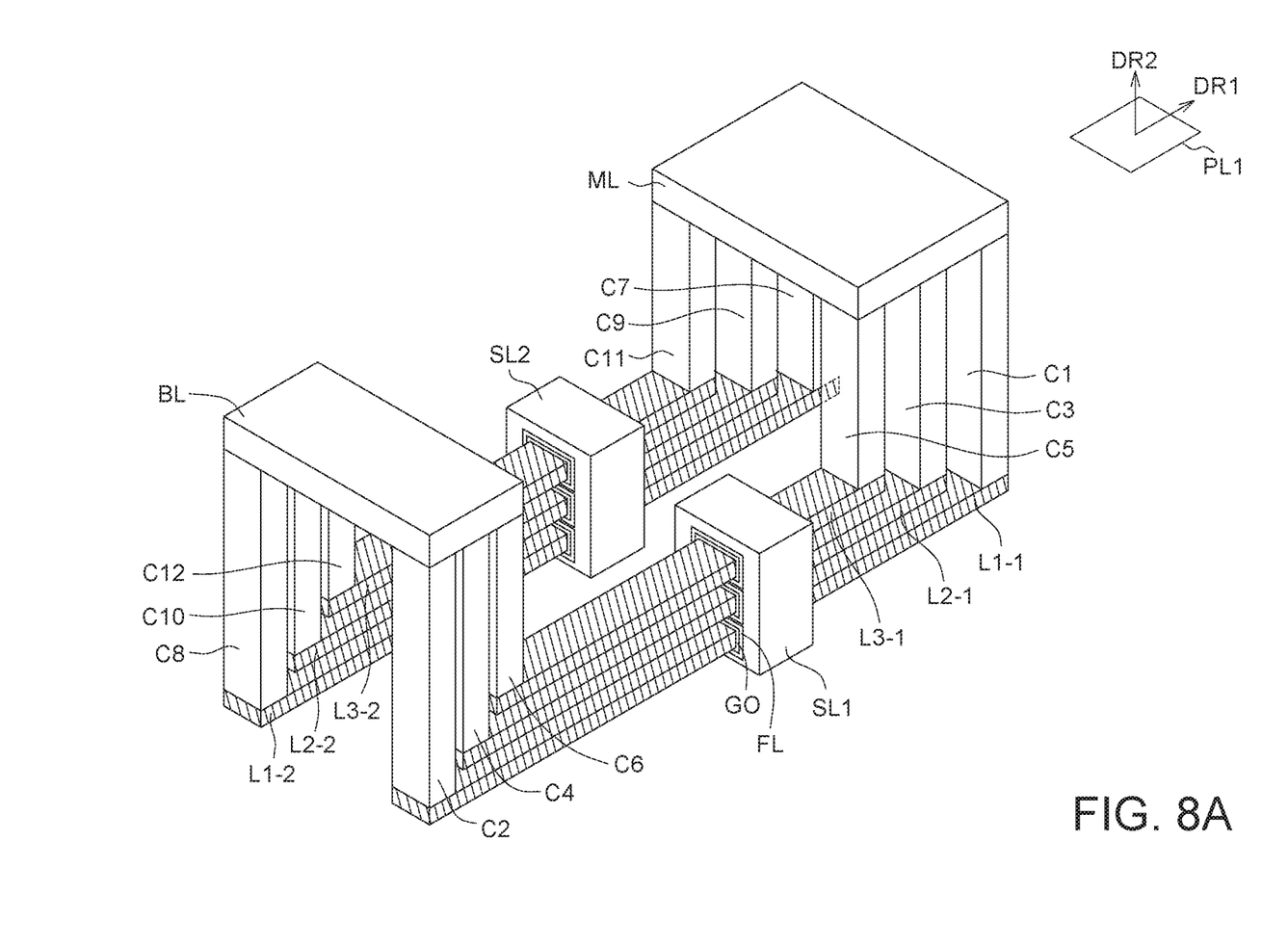
FIG. 8A shows a scheme diagram of portion of the TCAM architecture according to yet another embodiment of the present invention.
Figure 8B:
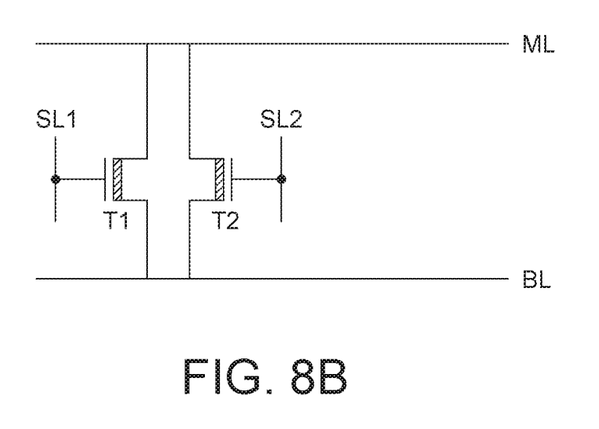
FIG. 8B shows a block diagram of equivalent circuit of the memory cell shown in FIG. 8A.

Referring to FIG. 8A, FIG. 8A shows a scheme diagram of portion of TCAM architecture according to yet another embodiment of the present invention. The architecture shown in FIG. 8A merely includes one memory cell. As shown in FIG. 8B, this memory cell may include a first transistor T1, a second transistor T2, a first search line SL1, a second search line SL2, a match line ML and a bit line BL. Since the first transistor T1 and the second transistor T2 are FeFETs, the first transistor T1 and the second transistor T2 may be used as memory elements. In this embodiment, the first transistor T1 and the second transistor T2 both include three channel layers. A first channel layer L1-1 of the first transistor T1 and a first channel layer L1-2 of the second transistor T2 are disposed on a first plane PL1. In an embodiment, the first channel layer L1-1 of the first transistor T1 and the first channel layer L1-2 of the second transistor T2 extend in a first direction DR1 parallel to the first plane PL1, and are parallel to each other. A second channel layer L2-1 of the first transistor T1 and a second channel layer L2-2 of the second transistor T2 are respectively stacked on the first channel layer L1-1 of the first transistor T1 and the first channel layer L1-2 of the second transistor T2 in a second direction DR2 perpendicular to the first plane PL1. In an embodiment, the second channel layer L2-1 of the first transistor T1 and the second channel layer L2-2 of the second transistor T2 extend in the first direction DR1, and are parallel to each other. A third channel layer L3-1 of the first transistor T1 and a third channel layer L3-2 of the second transistor T2 are respectively stacked on the second channel layer L2-1 of the first transistor T1 and the second channel layer L2-2 of the second transistor T2 in the second direction DR2. In an embodiment, the third channel layer L3-1 of the first transistor T1 and the third channel layer L3-2 of the second transistor T2 extend in the first direction DR1, and are parallel to each other. The first channel layer L1-1, the second channel layer L2-1 and the third channel layer L3-1 of the first transistor T1 penetrate through the first search line SL1, and are respectively connected with the first search line SL1 by a gate oxide GO and a ferroelectric layer FL. The first channel layer L1-2, the second channel layer L2-2 and the third channel layer L3-2 of the second transistor T2 penetrate through the second search line SL2, and are respectively connected with the second search line SL2 by a gate oxide GO and a ferroelectric layer FL. Contact materials C1, C3, C5, C7, C9, C11 are respectively disposed on a first terminal of the first channel layer L1-1, a first terminal of the second channel layer L2-1 and a first terminal of the third channel layer L3-1 of the first transistor T1 and a first terminal of the first channel layer L1-2, a first terminal of the second channel layer L2-2 and a first terminal of the third channel layer L3-2 of the second transistor T2. Each of the contact materials C1, C3, C5, C7, C9, C11 extends in the second direction, and is connected to the match line ML. Contact materials C2, C4, C6, C8, C10, C12 are respectively disposed on a second terminal of the first channel layer L1-1, a second terminal of the second channel layer L2-1 and a second terminal of the third channel layer L3-1 of the first transistor T1 and a second terminal of the first channel layer L1-2, a second terminal of the second channel layer L2-2 and a second terminal of the third channel layer L3-2 of the second transistor T2. Each of the contact materials C2, C4, C6, C8, C10, C12 extends in the second direction, and is connected to the bit line BL.

In this embodiment, the plurality channel layers of the first transistor/second transistor are stacked in the second direction. This stacked architecture may improve leakage speed of the memory cell. In other words, when searching data stored in the TCAM, the search results could be obtained faster.

In the above embodiments, the first plane PL1 may be located at a surface of a substrate (not shown). In addition, each of the contact materials may be a conductive metal or any conductive material which could transmit electrical signals. In addition, the transistors shown in FIGS. 3~7D may also refer to transistor layers or channel layers of the transistors. In addition, the section (e.g., the sections shown in FIGS. 4A~4C, 7A~7D) of each of the transistors (or transistor layers, channel layers of the transistors) may be any shape such as square, rectangle, trapezoid, diamond, round, oval, triangle, and different transistors may have different section shapes.

Noted that the scheme diagrams of the 3D TCAM merely show the parts/elements related to the present invention. For example, in practice, an insulating layer may be disposed between stacked transistors, which are not shown in the figures. In other words, the structure of the present invention may include any functional or inherent layers of the semiconductor process.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D architecture of ternary content-addressable memory (TCAM), comprising:
   a first transistor layer, disposed on a first plane, and extending in a first direction parallel to the first plane;
   a second transistor layer, disposed on the first plane, parallel to the first transistor layer, and extending in the first direction;
   a third transistor layer, stacked on the first transistor layer in a second direction perpendicular to the first plane; and
   a fourth transistor layer, stacked on the second transistor layer in the second direction,
   wherein two of the first transistor layer, the second transistor layer, the third transistor layer and the fourth transistor layer are a first transistor and a second transistor of a first memory cell of the TCAM, and the other two of the first transistor layer, the second transistor layer, the third transistor layer and the fourth transistor layer are a first transistor and a second transistor of a second memory cell of the TCAM.

2. The 3D architecture of TCAM according to claim 1, wherein the first transistor layer is the first transistor of the first memory cell, the second transistor layer is the second transistor of the first memory cell, the third transistor layer is the first transistor of the second memory cell, and the fourth transistor layer is the second transistor of the second memory cell, and
wherein the first transistor layer and the third transistor layer penetrate through a first search line, and are respectively connect with the first search line by a gate oxide, the second transistor layer and the fourth transistor layer penetrate through a second search line, and are respectively connect with the second search line by a gate oxide.

3. The 3D architecture of TCAM according to claim 2, further comprising:
a first contact material, disposed on a first terminal of the first transistor layer, extending in the second direction, and connected to a first match line via a first memory element which belongs to the first memory cell;
a second contact material, disposed on a second terminal of the first transistor layer, extending in the second direction, and connected to a first bit line;
a third contact material, disposed on a first terminal of the second transistor layer, extending in the second direction, and connected to the first match line via a second memory element which belongs to the first memory cell;
a fourth contact material, disposed on a second terminal of the second transistor layer, extending in the second direction, and connected to the first bit line;
a fifth contact material, disposed on a first terminal of the third transistor layer, extending in the second direction, and connected to a second match line via a third memory element which belongs to the second memory cell;
a sixth contact material, disposed on a second terminal of the third transistor layer, extending in the second direction, and connected to a second bit line;
a seventh contact material, disposed on a first terminal of the fourth transistor layer, extending in the second direction, and connected to the second match line via a fourth memory element which belongs to the second memory cell; and
an eighth contact material, disposed on a second terminal of the fourth transistor layer, extending in the second direction, and connected to the second bit line.

4. The 3D architecture of TCAM according to claim 2, wherein the doping type of the first transistor layer, the second transistor layer, the third transistor layer and the fourth transistor layer are the same, N-type or P-type.

5. The 3D architecture of TCAM according to claim 1, wherein the first transistor layer is the first transistor of the first memory cell, the third transistor layer is the second transistor of the first memory cell, the second transistor layer is the first transistor of the second memory cell, and the fourth transistor layer is the second transistor of the second memory cell, and
wherein the first transistor layer, the second transistor layer, the third transistor layer and the fourth transistor layer penetrate through a common search line, and are respectively connect with the common search line by a gate oxide.

6. The 3D architecture of TCAM according to claim 5, further comprising:
a first contact material, disposed on a first terminal of the first transistor layer, extending in the second direction, and connected to a first match line via a first memory element which belongs to the first memory cell;
a second contact material, disposed on a second terminal of the first transistor layer, extending in the second direction, and connected to a first bit line;
a third contact material, disposed on a first terminal of the third transistor layer, extending in the second direction, and connected to the first match line via a second memory element which belongs to the first memory cell;
a fourth contact material, disposed on a second terminal of the third transistor layer, extending in the second direction, and connected to the first bit line;
a fifth contact material, disposed on a first terminal of the second transistor layer, extending in the second direction, and connected to a second match line via a third memory element which belongs to the second memory cell;
a sixth contact material, disposed on a second terminal of the second transistor layer, extending in the second direction, and connected to a second bit line;
a seventh contact material, disposed on a first terminal of the fourth transistor layer, extending in the second direction, and connected to the second match line via a fourth memory element which belongs to the second memory cell; and
an eighth contact material, disposed on a second terminal of the fourth transistor layer, extending in the second direction, and connected to the second bit line.

7. The 3D architecture of TCAM according to claim 5, wherein the doping type of one of the first transistor layer and the third transistor layer is N-type and the other one is P-type, the doping type of one of the second transistor layer and the fourth transistor layer is N-type and the other one is P-type.

8. The 3D architecture of TCAM according to claim 1, wherein the first transistor layer is the first transistor of the first memory cell, the third transistor layer is the second transistor of the first memory cell, the second transistor layer is the first transistor of the second memory cell, and the fourth transistor layer is the second transistor of the second memory cell, and
wherein the first transistor layer and the third transistor layer penetrate through a first common search line, and are respectively connect with the first common search line by a gate oxide, the second transistor layer and the fourth transistor layer penetrate through a second common search line, and are respectively connect with the second common search line by a gate oxide.

9. The 3D architecture of TCAM according to claim 8, further comprising:
a first contact material, disposed on a first terminal of the first transistor layer, extending in the second direction, and connected to a match line via a first memory element which belongs to the first memory cell;
a second contact material, disposed on a second terminal of the first transistor layer, extending in the second direction, and connected to a bit line;
a third contact material, disposed on a first terminal of the third transistor layer, extending in the second direction, and connected to the match line via a second memory element which belongs to the first memory cell;

a fourth contact material, disposed on a second terminal of the third transistor layer, extending in the second direction, and connected to the bit line;

a fifth contact material, disposed on a first terminal of the second transistor layer, extending in the second direction, and connected to the match line via a third memory element which belongs to the second memory cell;

a sixth contact material, disposed on a second terminal of the second transistor layer, extending in the second direction, and connected to the bit line;

a seventh contact material, disposed on a first terminal of the fourth transistor layer, extending in the second direction, and connected to the second match line via a fourth memory element which belongs to the memory cell; and an eighth contact material, disposed on a second terminal of the fourth transistor layer, extending in the second direction, and connected to the bit line.

10. The 3D architecture of TCAM according to claim 8, wherein the doping type of one of the first transistor layer and the third transistor layer is N-type and the other one is P-type, the doping type of one of the second transistor layer and the fourth transistor layer is N-type and the other one is P-type.

11. The 3D architecture of TCAM according to claim 1, wherein the first transistor layer is the first transistor of the first memory cell, the third transistor layer is the second transistor of the first memory cell, the second transistor layer is the first transistor of the second memory cell, and the fourth transistor layer is the second transistor of the second memory cell, and wherein the first transistor layer, the second transistor layer, the third transistor layer and the fourth transistor layer penetrate through a common search line, and are respectively connect with the common search line by a gate oxide.

12. The 3D architecture of TCAM according to claim 11, further comprising:

a first contact material, disposed on a first terminal of the first transistor layer, extending in the second direction, and connected to a first match line via a first memory element which belongs to the first memory cell;

a second contact material, disposed on a second terminal of the first transistor layer, extending in the second direction, and connected to a first bit line;

a third contact material, disposed on a first terminal of the second transistor layer, extending in the second direction, and connected to the first match line via a second memory element which belongs to the first memory cell;

a fourth contact material, disposed on a second terminal of the second transistor layer, extending in the second direction, and connected to the first bit line;

a fifth contact material, disposed on a first terminal of the third transistor layer, extending in the second direction, and connected to a second match line via a third memory element which belongs to the second memory cell;

a sixth contact material, disposed on a second terminal of the third transistor layer, extending in the second direction, and connected to a second bit line;

a seventh contact material, disposed on a first terminal of the fourth transistor layer, extending in the second direction, and connected to the second match line via a fourth memory element which belongs to the second memory cell; and an eighth contact material, disposed on a second terminal of the fourth transistor layer, extending in the second direction, and connected to the second bit line.

13. The 3D architecture of TCAM according to claim 11, wherein the doping type of one of the first transistor layer and the second transistor layer is N-type and the other one is P-type, the doping type of one of the third transistor layer and the fourth transistor layer is N-type and the other one is P-type.

14. A 3D architecture of ternary content-addressable memory (TCAM), comprising:

a first transistor channel layer, disposed on a first plane, and extending in a first direction parallel to the first plane;

a second transistor channel layer, disposed on the first plane, parallel to the first transistor channel layer, and extending in the first direction;

a third transistor channel layer, stacked on the first transistor channel layer in a second direction perpendicular to the first plane; and a fourth transistor channel layer, stacked on the channel second transistor layer in the second direction, wherein the first transistor channel layer and the third transistor channel layer belong to a first transistor of a memory cell of the TCAM, and the second transistor channel layer, and the fourth transistor channel layer belong to a second transistor of the memory cell of the TCAM.

15. The 3D architecture of TCAM according to claim 14, wherein the first transistor channel layer and the third transistor channel layer penetrate through a first search line, and are respectively connect with the first search line by a gate oxide and a ferroelectric material layer, the second transistor channel layer and the fourth transistor channel layer penetrate through a second search line, and are respectively connect with the second search line by a gate oxide and a ferroelectric material layer.

16. The 3D architecture of TCAM according to claim 14, further comprising:

a first contact material, disposed on a first terminal of the first transistor channel layer, extending in the second direction, and connected to a match line;

a second contact material, disposed on a second terminal of the first transistor channel layer, extending in the second direction, and connected to a bit line;

a third contact material, disposed on a first terminal of the second transistor channel layer, extending in the second direction, and connected to the match line;

a fourth contact material, disposed on a second terminal of the second transistor channel layer, extending in the second direction, and connected to the bit line;

a fifth contact material, disposed on a first terminal of the third transistor channel layer, extending in the second direction, and connected to the match line;

a sixth contact material, disposed on a second terminal of the third transistor channel layer, extending in the second direction, and connected to the bit line;

a seventh contact material, disposed on a first terminal of the fourth transistor channel layer, extending in the second direction, and connected to the second match line; and an eighth contact material, disposed on a second terminal of the fourth transistor channel layer, extending in the second direction, and connected to the bit line.

\* \* \* \* \*